(12) United States Patent
Muramatsu et al.

(10) Patent No.: US 7,750,836 B2
(45) Date of Patent: Jul. 6, 2010

(54) SOLID-STATE IMAGING DEVICE, METHOD OF DRIVING SOLID-STATE IMAGING DEVICE AND CAMERA

(75) Inventors: Yoshinori Muramatsu, Kanagawa (JP); Kiyotaka Amano, Tokyo (JP); Atsushi Suzuki, Kanagawa (JP); Noriyuki Fukushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 792 days.

(21) Appl. No.: 11/682,053

(22) Filed: Mar. 5, 2007

(65) Prior Publication Data

US 2008/0252767 A1 Oct. 16, 2008

(30) Foreign Application Priority Data

Mar. 6, 2006 (JP) ............................. P2006-059023

(51) Int. Cl.
*H03M 1/56* (2006.01)
(52) U.S. Cl. ...................................... 341/169; 341/164
(58) Field of Classification Search ................. 341/164, 341/165, 166, 169, 170
See application file for complete search history.

(56) References Cited

U.S. PATENT DOCUMENTS

2008/0239124 A1* 10/2008 Mori et al. .................. 348/308
2008/0284886 A1* 11/2008 Wakabayashi et al. ...... 348/301

FOREIGN PATENT DOCUMENTS

| JP | 2004-112740 | 4/2004 |
| JP | 2004-222273 | 8/2004 |
| JP | 2004-248304 | 9/2004 |
| JP | 2005-323331 | 11/2005 |
| JP | 2007036916 A * | 2/2007 |

OTHER PUBLICATIONS

Japanese Patent Office Action corresponding to Japanese Serial No. 2006-059023 dated Jul. 7, 2009.

* cited by examiner

*Primary Examiner*—Howard Williams
(74) *Attorney, Agent, or Firm*—Sonnenschein Nath & Rosenthal LLP (57) ABSTRACT

A solid-state imaging device including: an analog-digital converter unit in column parallel arrangement, the analog-digital converter unit having a plurality of pixels arranged to convert an incident light quantity to an electric signal, in which an analog signal obtained from the pixel is converted into a digital signal, wherein the analog-digital converter unit is configured of: a comparator operable to compare a value of a column signal line from which an analog signal obtained by the pixel is outputted with a value of a reference line, and a counter operable to measure a time period by the time when comparison done by the comparator is finished and to store the comparison result, wherein the solid-state imaging device further includes: a module for controlling an output of the comparator operable to control the output of the comparator depending on the output of the comparator.

14 Claims, 11 Drawing Sheets

SOLID-STATE IMAGING DEVICE, METHOD OF DRIVING SOLID-STATE IMAGING DEVICE AND CAMERA

CROSS REFERENCES TO RELATED APPLICATIONS

The present invention contains subject matter related to Japanese Patent Application JP 2006-059023 filed in the Japanese Patent Office on Mar. 6, 2006 the entire contents of which being incorporated herein by reference.

BACKGROUND OF THE INVENTION

1. Field of the Invention

The present invention relates to a solid-state imaging device, a method of driving a solid-state imaging device and a camera 2. Description of the Related Art In the solid-state imaging device, a dark defect phenomenon is a problem. As a technique to avoid the dark defect phenomenon, a technique below is disclosed (for example, see JP-A-2004-248304 (Patent Reference 1)).

Figure 9:
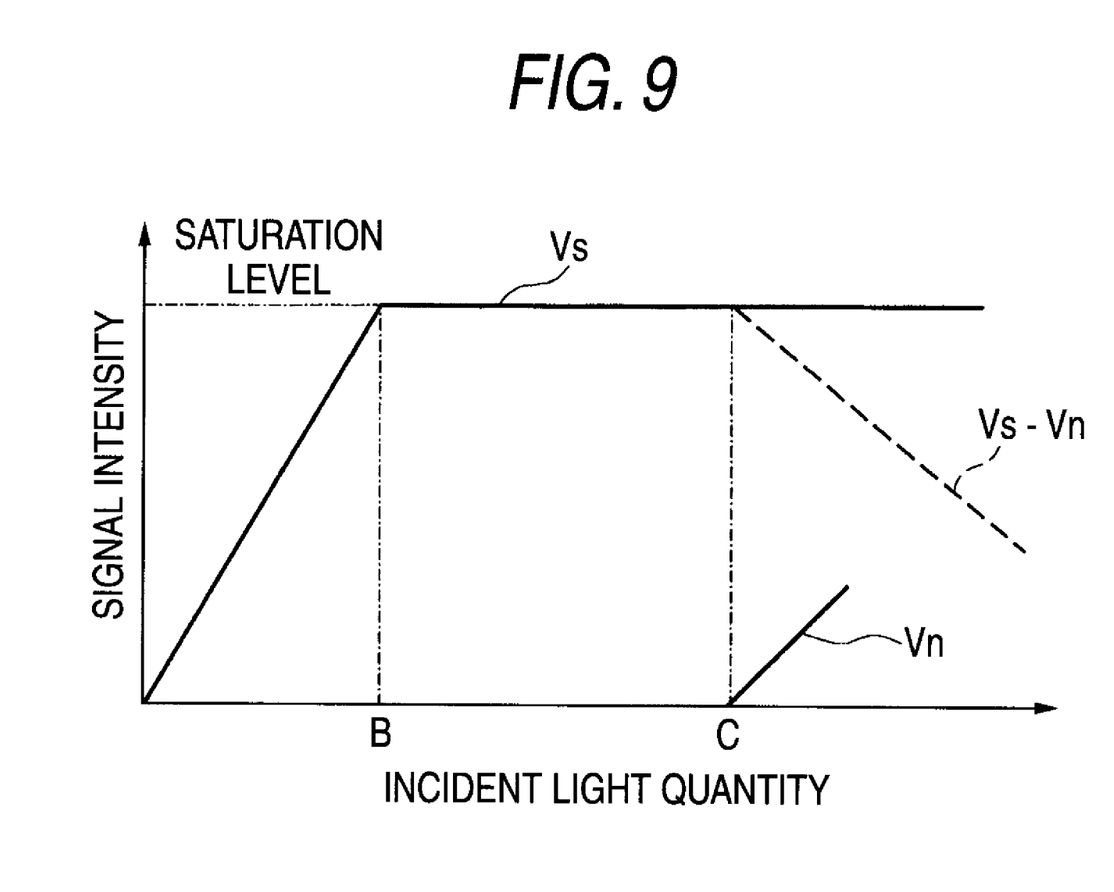
FIG. 9 shows a diagram depicting the relation between the signal intensity and the incident light quantity for describing the dark defect phenomenon.

The technique is a technique that uses a means for correcting an event that performs a differential process depending on the output of a detection circuit. As shown in FIG. 9, generally, a signal is generated in photoelectric conversion done by a means for photoelectric conversion, the signal is inputted to an amplifier transistor to output a signal Vs. The signal Vs contains a signal generated by photoelectric conversion and a reset signal Vn. Therefore, when a differential amplifier reads the signal Vs as the signal generated by photoelectric conversion, the reset signal Vn of a noise component is subtracted therefrom to output the signal generated by photoelectric conversion as a signal Vs–Vn.

Then, when the incident light quantity is stronger than that at Point B, the signal is saturated to output a constant value. When much stronger light enters, the reset level Vn is changed to make the signal Vs–Vn small. This is turned to the dark defect phenomenon.

More specifically, when a very strong light enters a photoelectric converting part, a light leakage noise signal is added to the reset signal of the noise component at the input part of the amplifier transistor due to the light leakage. In the state in the area in which the incident light quantity is stronger than that at Point C, the output of the differential amplifier, Vs–Vn, is made small. When the light leakage noise signal Vn is saturated, the output Vs–Vn of the differential amplifier signal is turned to zero. This state means that even though a really bright subject is imaged, the dark defect phenomenon occurs in which the image is darkened.

Figure 10:
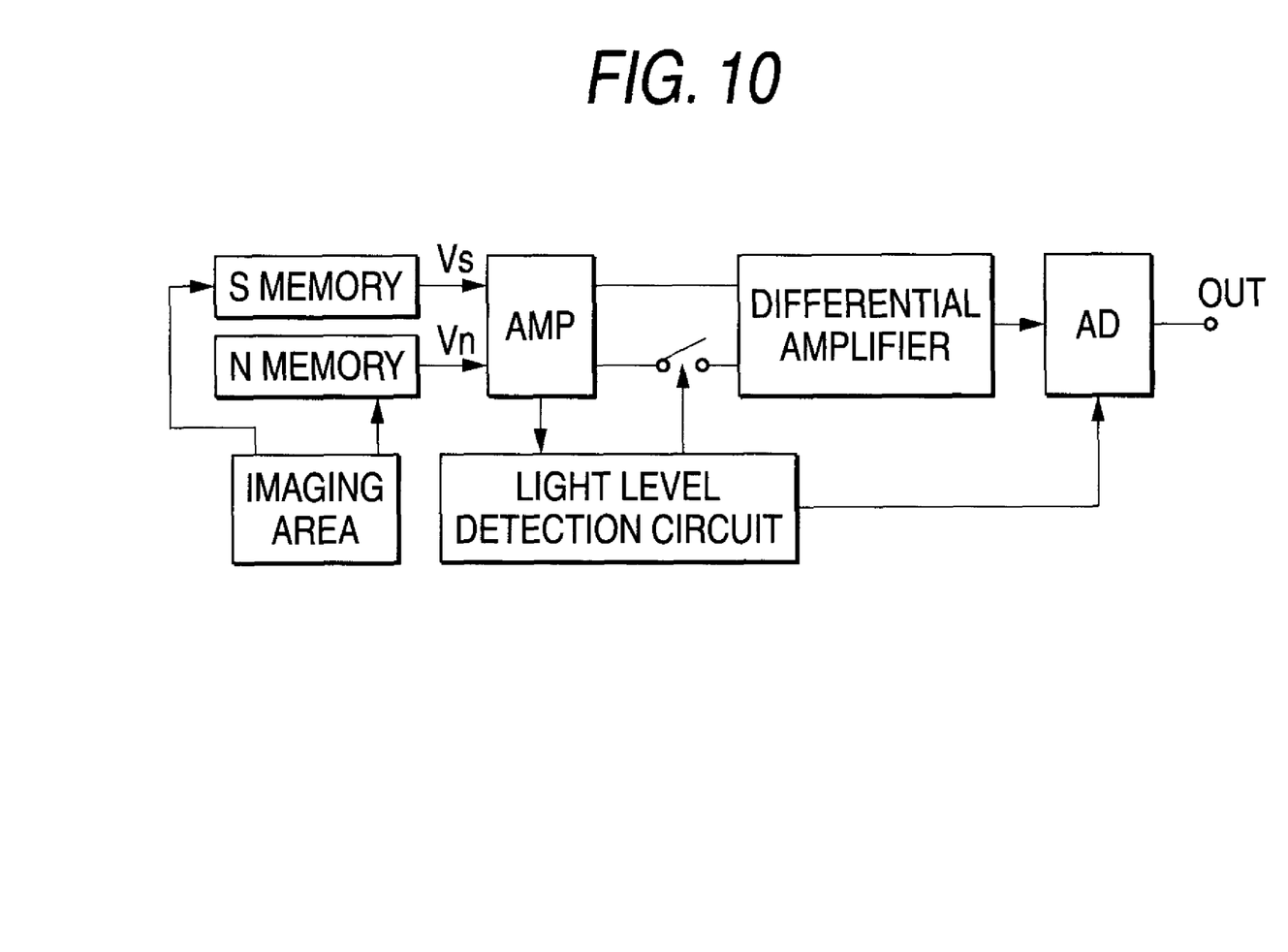
FIG. 10 shows a block diagram depicting the configuration of the technique before.

This characteristic is utilized to determine whether the light is very strong or not from the area where Vn is varied and from the area where Vs is saturated. This is sufficient that a photo-detection circuit determines whether the signal is corrected from here or not. As shown in FIG. 10, when the signal is corrected, there is a scheme in which the signal is corrected before an analog-digital converter circuit A/D without performing the differential process. Furthermore, as shown in FIG. 11, when a memory is read that stores the value of the analog-digital converter circuit A/D, there is a scheme in which the signal is corrected by a converter circuit to output it, the converter circuit corrects the event that performs the differential process depending on the output from the light level detection circuit.

In the technique shown in FIG. 10, when a dark defect is detected to correct the signal before the analog-digital converter circuit A/D, it is necessary to provide a correction signal circuit, for example, a constant voltage circuit other than a detection circuit, which causes an increase in the circuit scale as the configuration of the dark defect correction circuit.

Figure 11:
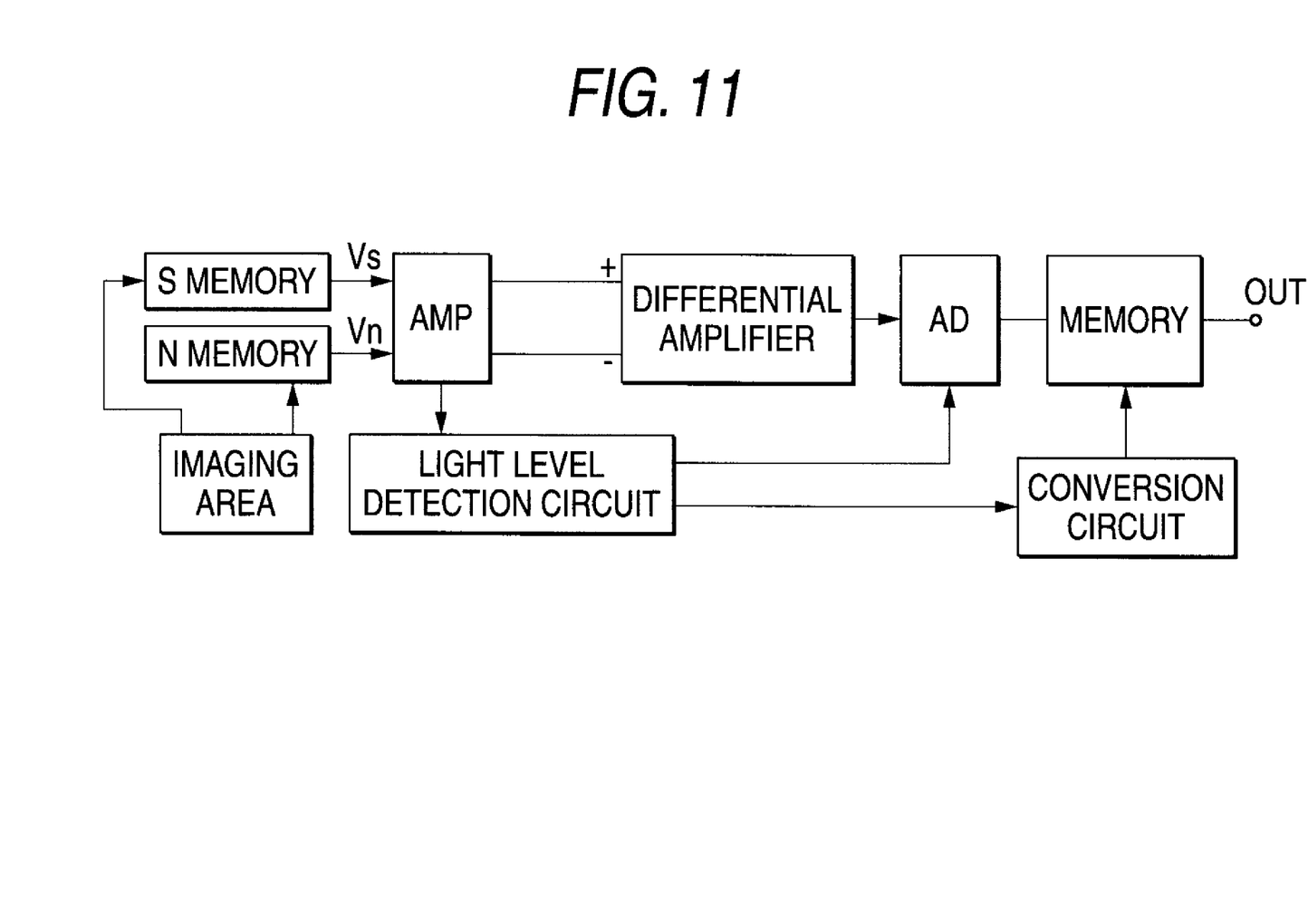
FIG. 11 shows a block diagram depicting the configuration of the technique before.

In the technique shown in FIG. 11, it is necessary to provide a circuit which interrupts the correction signal into the memory, which also causes an increase in the circuit scale. In the circuit system in which analog-digital conversion is performed in each of signal lines, the area is greatly affected.

In any of the techniques before, it is necessary to additionally provide a light level detection circuit exclusive for detecting the dark defect in order to detect the dark defect. In addition, since it is necessary to provide an analog sensing detection circuit in an analog signal path, a problem also arises that an analog signal itself might be adversely affected.

SUMMARY OF THE INVENTION

The invention addresses the above-identified and the other problems associated with the related-art techniques in that the circuit configuration is a large scale because it is necessary to additionally provide a light level detection circuit exclusive for detecting the dark defect, and the analog signal itself might be adversely affected because it is necessary to additionally provide the analog sensing detection circuit in the analog signal path.

It is desirable to prevent the dark defect phenomenon from occurring by additionally providing a simple circuit configuration without affecting the analog signal.

An embodiment of the invention is a solid-state imaging device including: an analog-digital converter unit in column parallel arrangement, the analog-digital converter unit having a plurality of pixels arranged to convert an incident light quantity to an electric signal, in which an analog signal obtained from the pixel is converted into a digital signal, wherein the analog-digital converter unit is configured of: a comparator operable to compare a value of a column signal line from which an analog signal obtained by the pixel is outputted with a value of a reference line, and a counter operable to measure a time period by the time when comparison done by the comparator is finished and to store the comparison result, wherein the solid-state imaging device further includes: means for controlling an output of the comparator operable to control the output of the comparator depending on the output of the comparator.

According to an embodiment of the invention, dark defect detection itself is performed by the comparator which is a component of the analog-digital converter unit in column parallel arrangement, and the dark defect phenomenon is prevented by additionally providing only the means for controlling the output of the comparator operable to control the output of the comparator depending on the output of the comparator. Therefore, as compared with the technique before in which it is necessary to provide the detection circuit for exclusive use, an advantage is provided that the circuit configuration is made simple. In addition, an advantage is provided as well that the analog signal is not adversely affected because no circuit is additionally provided in the analog area.

DETAILED DESCRIPTION OF THE INVENTION

An embodiment (first embodiment) of the invention will be described with reference to a block diagram shown in FIG. 1. For describing the first embodiment of the invention, FIG. 1 shows a CMOS imaging sensor on which a column parallel analog/digital converting unit is mounted.

Figure 1:
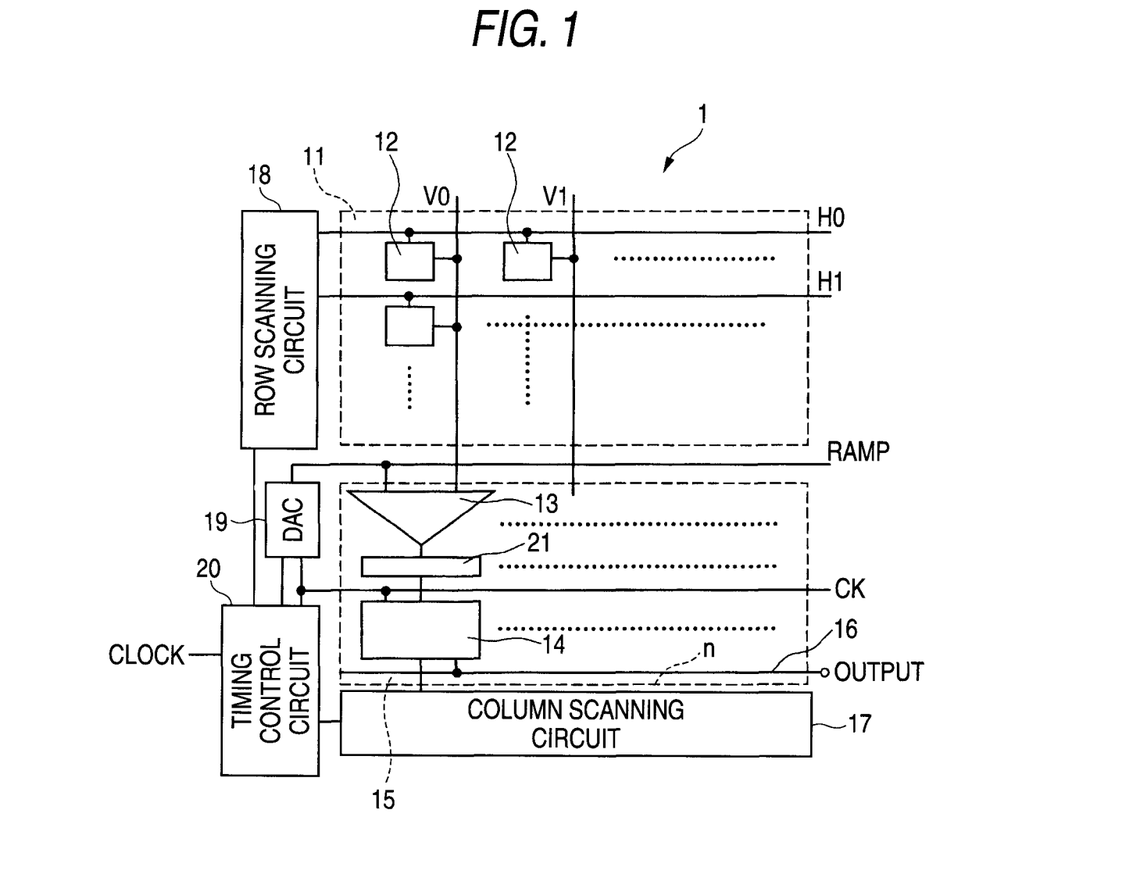
FIG. 1 shows a block diagram depicting an embodiment (first embodiment) of the invention.

As shown in FIG. 1, a solid-state imaging device 1 has a plurality of unit pixels (hereinafter, simply called pixels) 12 arranged two dimensionally in a matrix, for example, which configures a pixel array 11. For example, each of the pixels 12 is configured of a photodiode and an amplifier in the pixel.

A column parallel A/DC block 15, which is the column parallel analog/digital converting unit, compares a reference signal of a reference line RAMP generated by a digital-analog converting unit (hereinafter, abbreviated to DAC, DAC is abbreviation of a Digital-Analog converter) 19 which generates the reference signal (reference voltage) with an analog signal obtained each through column signal lines V0, V1 and so on from the unit pixel 12 at each of row lines H0, H1 and so on. For example, the column parallel A/DC block 15 is configured of a comparator 13 arranged for each of the column signal lines V0, V1 and so on, a module 21 for controlling the output of the comparator operable to control the output of the comparator 13 depending on the output of the comparator 13 in order to correct dark defect detection, and a counter 14 operable to count a comparison time period, the block is provided with a digital signal converting function for n bits (n is a natural number).

A horizontal output line 16 is configured of an output line in n bit width (n is a natural number), and n circuits of sense circuits and n circuits of output circuits each corresponding to the output lines. In addition, for a control circuit which sequentially reads the signals of the pixel array 11, a timing control circuit 20 operable to generate internal clocks, a row scanning circuit 18 operable to control row addressing and row scanning, and a column scanning circuit 17 operable to control column addressing and column scanning are arranged.

For the counter 14, a counter may be provided separately in order to compute the read results of the reset component and the signal component from the unit pixel 12 for two times. In addition, for a simplified configuration, an up-down counter configuration is desirable. More preferably, a memory module operable to store the count result is further provided to allow the parallel operation of comparison, count and output by the column parallel A/DC block 15.

In addition, the horizontal output line 16 is configured of the output line in n bit width, the sense circuit and the output circuit, where the number is n here. Each of them may be arranged by n*m (m is a natural number) in parallel to accelerate the output. It is also effective in which a parallel-serial converter circuit, or a serial-parallel converter circuit is placed between the sense circuit and the output circuit where the numbers of the output line and the sense circuit are n*m, and the number of the output circuit is n*1 (m≠1, 1 is a natural number).

Figure 2:
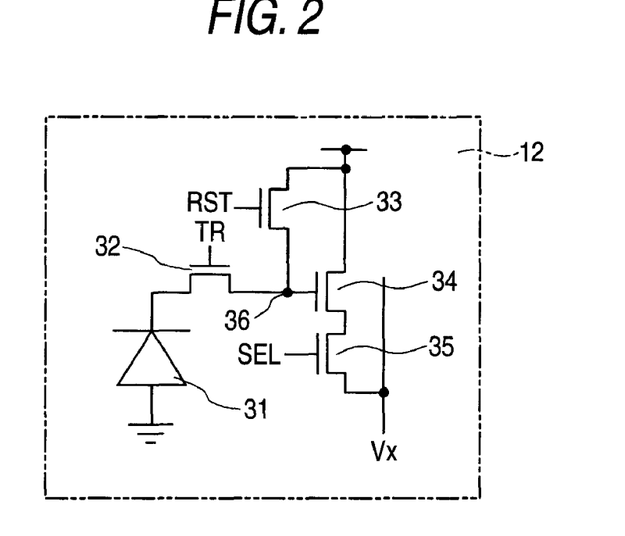
FIG. 2 shows a circuit diagram depicting an exemplary circuit configuration of a unit pixel.

FIG. 2 shows an exemplary circuit configuration of the unit pixel 12. The unit pixel 12 is configured of a photodiode 31, a transfer transistor 32 operable to transfer the electric charge of the photodiode 31 to a floating diffusion layer 36, an amplifier transistor 34 operable to signal-amplify the electric charge of the floating diffusion layer 36 by reading the source follower along with a current source provided at the Vx end, a reset transistor 33 operable to reset the electric charge of the floating diffusion layer 36, and a selection transistor 35 operable to read the signal to Vx. In this exemplary configuration, all the transistors are N channel transistors. However, a similar configuration may be done in which a part of or all the transistors are P channel transistors. In addition, the following configurations may be done: the configuration without the transfer transistor 32, the configuration in which selection control is performed by the power source itself without the selection transistor 35, the configuration in which a given component is shared by a plurality of the unit pixels, etc.

Figure 3:
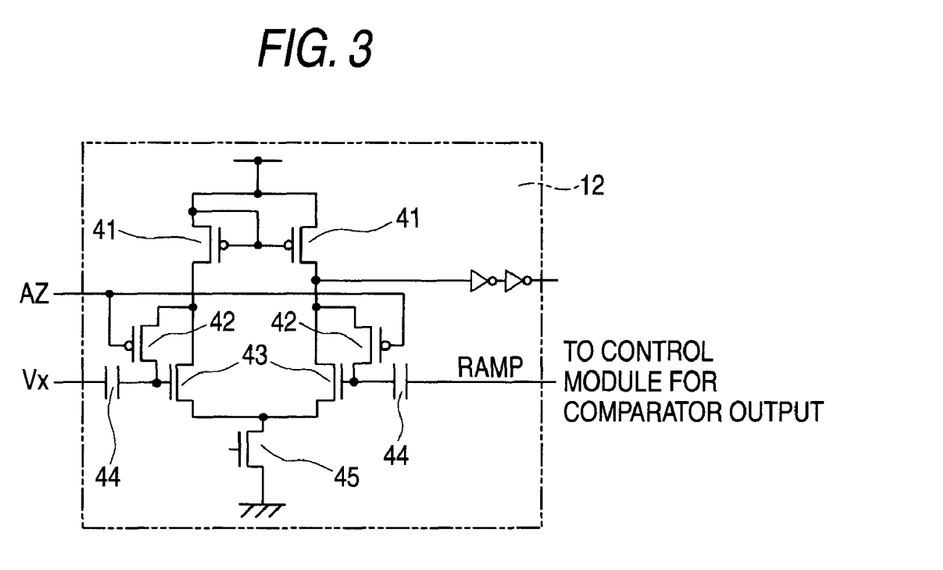
FIG. 3 shows a circuit diagram depicting an exemplary circuit configuration of a comparator.

FIG. 3 shows an exemplary circuit configuration of the comparator 13. The comparator 13 is configured of a differential amplifying part which receives an N channel pair transistor 43 as input, and is formed of a P channel pair transistor 41, and an N channel transistor 45 whose gate is freely biased to operate as a constant current source; a P channel transistor which serves as a switching transistor 42 to connect the drain and the gate of the input N channel transistors 43; and a capacitance 44 which cuts the DC level of the gate of the N channel transistor 43 to be the input for each part.

In the capacitance 44, one end is connected to the input N channel transistor 43 of the differential amplifier, and the other end is connected to the analog output Vx of the unit pixel 12, or to the reference line RAMP from the DAC 19. For the input transistor, a similar configuration may be done to have the P channel transistor depending on the input value. In addition, for the differential amplifying part, the configuration laterally inverted may be done including the output.

Figure 4:
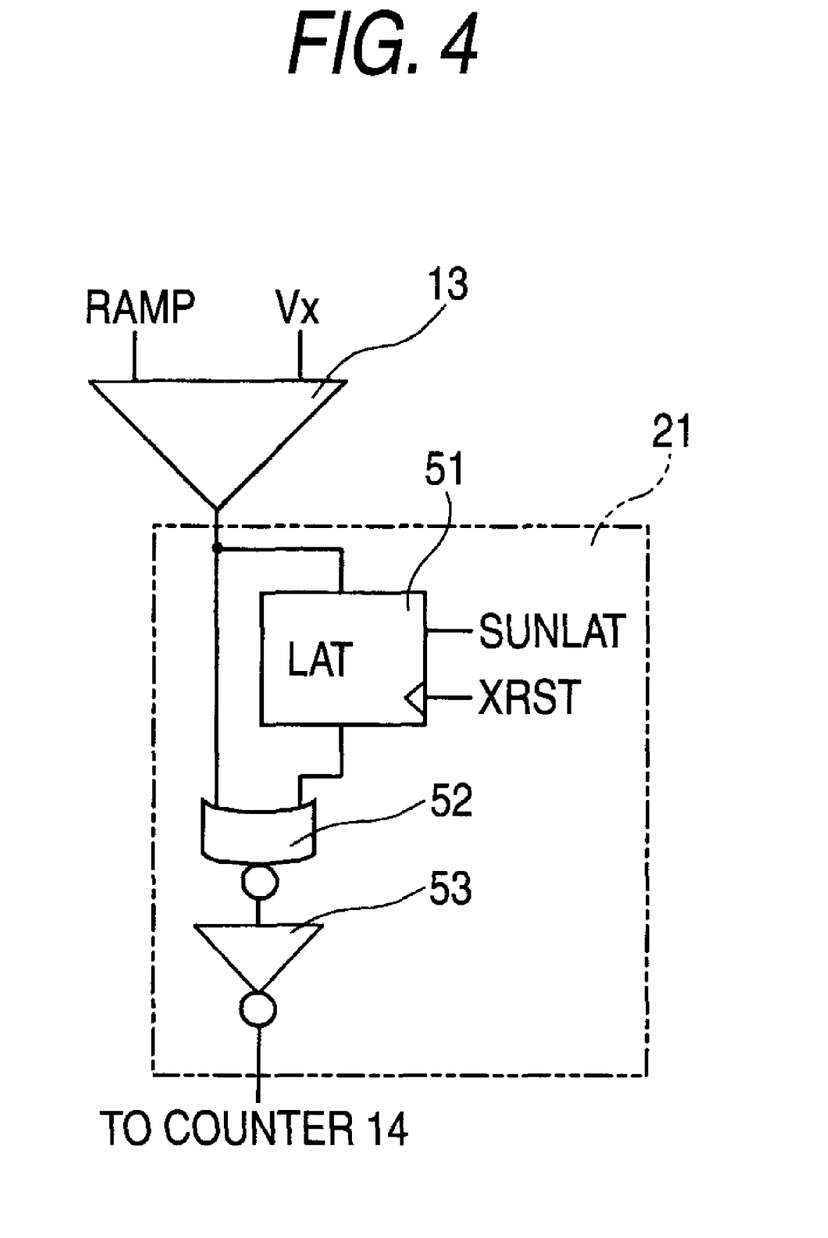
FIG. 4 shows a circuit diagram depicting an exemplary circuit configuration of means for controlling the output of the comparator.

FIG. 4 shows an exemplary circuit configuration of the control module 21 for the output of the comparator. The control module 21 is configured of a latch 51 which receives the output of the comparator 13 as input, is initialized by an XRST signal, and latches the output of the comparator 13 by a SUNLAT signal; a NOR logic gate 52 which has the output of the comparator 13 at one input and the output of the latch 51 at the other input; and an inverter 53 which receives the output of the NOR logic gate 52 and outputs it to the counter 14. Depending on the output of the comparator 13, the logic is inverted to allow a similar configuration. The initialization by the XRST signal is that the output of the NOR logic gate 52 is the output decided by the comparator 13.

In the circuit configuration, the latch 51 is provided in the comparator 13 in which the latch 51 holds the event whether the output of the comparator 13 after the reset level is finished is inverted or not inverted to measure the subsequent signal level depending on the event. The circuit configuration is formed in which while the signal level is being measured, it can be switched whether the output of the comparator 13 is fixed to high level or the signal level is measured.

Figure 5:
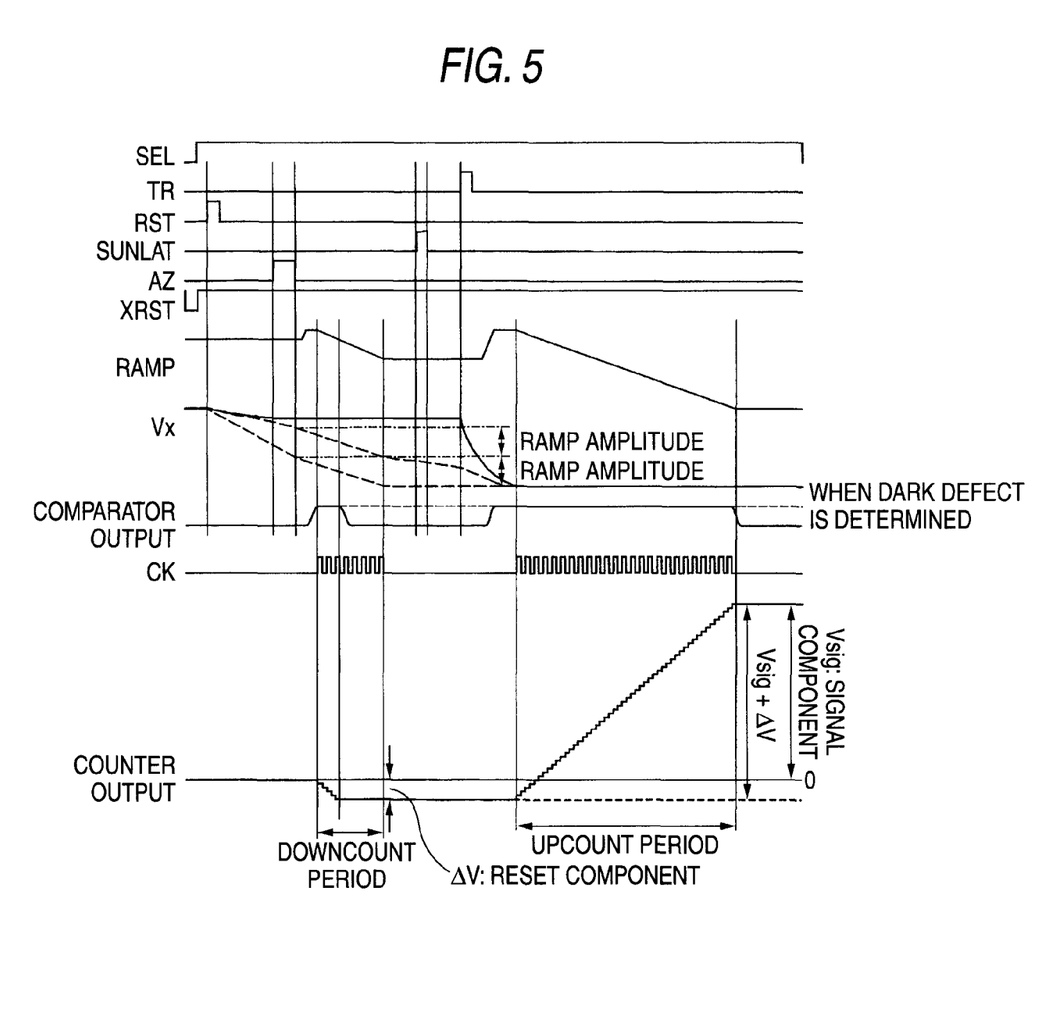
FIG. 5 shows a timing chart depicting the first embodiment.

Next, the operation of the solid-state imaging device 1 (CMOS imaging sensor) discussed in the first embodiment will be described with reference to a block diagram shown in FIG. 1, a circuit diagrams shown in FIGS. 2, 3, and 4, and a timing chart shown in FIG. 5.

About the time when a first time read from the unit pixel 12 of a given row Hx (H0, H1 and so on) to the column signal lines V0, V1 and so on is stabilized, the operating point of the comparator 13 is initialized by the value of the column signal line Vx and the value of the reference line RAMP in auto-zero (hereinafter, abbreviated to AZ) activation by an AZ signal. In other words, when it is at the reset level, the comparator 13 is initialized to match the value of the reference line RAMP and the value of the column signal line Vx with Point 0. This means that in the circuit configuration of the comparator shown in FIG. 3, the capacitance 44 cuts the DC component, the value removed of the DC component is applied to the auto-zero operation with respect to the column signal line Vx and the reference line RAMP, whereby the value below the AZ signal is stored in the capacitance 44 to match Point 0.

After that, in order to avoid initial variations caused by the auto-zero operation, the DAC 19 temporarily adds a slight offset to the reference signal value of the reference line RAMP, a staircase wave is inputted that the reference signal value is time varied, and the comparator 13 compares it with the voltage of a given column signal line Vx. Upon inputting the staircase wave to the reference line RAMP, the counter 14 makes a first time count.

When the voltage of the reference line RAMP and the voltage of the column signal line Vx are equal, the output of the comparator 13 is inverted, and at the same time, the count value is stored in the counter 14 in accordance with the comparison time. In the first time read, the selection transistor 35 is activated by the selection (SEL) signal of the unit pixel 12, and then the reset transistor 33 is activated by the reset (RST) signal to read the reset component $\Delta V$. In the reset component $\Delta V$, noise varied for every the unit pixel 12 is contained as offsets.

However, the variations in the reset component $\Delta V$ are generally small, and the value of the reset component $\Delta V$ is common in all the pixels. Therefore, the output of a given column signal line Vx is almost already known. Furthermore, the AZ signal is activated to initialize the operating point of the comparator 13 by the value of the column signal line Vx and the value of the reference line RAMP at this time. Therefore, when the reset component $\Delta V$ is read for the first time, the reference voltage of the reference line RAMP is adjusted in such a way that the comparison time period at the add numbered time is made equal or shorter than the comparison time period at the even numbered time, whereby the comparison time period can be shortened greatly. In the first embodiment, the reset component $\Delta V$ is compared for the count period of seven bits (128 clocks). The SUNLAT signal is activated during the time from the end of the first time read to the start of the second time read, whereby the control module 21 for the output of the comparator latches the output of the comparator 13 at this time.

In the second time read, almost the same operation as the first time read is performed in which the transfer transistor 32 is activated by the TR signal while the selection transistor 35 is retained in the activated state by the SEL signal of the unit pixel 12, whereby the signal component is read in accordance with the incident light quantity for every unit pixel 12, in addition to the reset component $\Delta V$. In other words, after the second time read from the unit pixel 12 of a given row Hx to the column signal lines V0, V1 and so on is stabilized, the DAC 19 inputs a staircase wave that the reference signal (reference voltage) is time varied to the reference line RAMP, and the comparator 13 compares it with the voltage of a given column signal line Vx. Upon inputting a staircase wave to the reference line RAMP, the counter 14 makes a second time count.

When the voltage of the reference line RAMP and the voltage of the column signal line Vx are equal, the output of the comparator 13 is inverted, and at the same time, the count value in accordance with the comparison time period is stored in the counter 14. At this time, in the first time count and the second time count, the first time count is the down-count, whereas the second time count is the up-count, whereby (the count value at the second time)–(the count value at the first time) is automatically stored in the counter. In the read of the signal component+the reset component $\Delta V$ at the second time, since it is necessary to make counts in a wide signal range, the signal component+the reset component $\Delta V$ are compared for the count period of 12 bits (4096 clocks) in the embodiment.

After the period for analog/digital conversion (hereinafter, denoted as A/D conversion) is finished, the column scanning circuit 17 externally outputs n bits of the digital signal stored in the counter 14 through n lines of the horizontal output lines 16. After that, a similar operation is sequentially repeated for every row, and a two dimensional image is created.

In the operation described above, in normal operation, since the output of the comparator 13 is inverted after the first time read is finished, the inverted output of the comparator 13 is latched in the latch 51 inside the control module 21 for the output of the comparator by the SUNLAT signal. Originally, the output of the NOR logic gate 52 is configured to be decided depending on the output of the comparator 13 by the XRST signal. Since the output of the NOR logic gate 52 is continuously decided depending on the output of the comparator 13 after the inverted output of the comparator 13 is latched, the second time read is to be decided depending on the output of the comparator 13.

In the normal case, the value of the column signal line Vx is constant when the reset level is set. However, when extremely excessive light enters the photodiode 31 of the unit pixel 12, the electric charge of the photodiode 31 sometimes leaks to the floating diffusion layer 36 in the first time read. When this occurs, the value of the column signal line Vx suddenly drops in the first time read (dotted lines of Vx in FIG. 5). The manner to drop is greater than the amplitude that the reset level of the reference signal is compared when the comparison of the reset level to the level of auto-zero (AZ) is finished. The comparator 13 is in the state not to be comparable when the value of the column signal line Vx drops.

Generally, the output of the comparator 13 is inverted at the point in time when the value of the column signal line Vx and the value of the reference signal of the reference line RAMP are equal to the level of auto-zero (AZ). However, when (the count value at the second time)–(the count value at the first time) is done, the signal is outputted as a black signal or a signal nearly black because the difference is small, which causes the dark defect phenomenon.

When the light of high intensity enters due to the dark defect phenomenon, the value of the column signal line Vx drops. Thus, when the manner to drop becomes extremely great and becomes greater than the amplitude of the output value of the reference line RAMP, the output of the comparator 13 is not inverted, and it remains in the state of high level. In short, it utilizes the event that the output of the comparator 13 is not inverted when the amount of drop is equal to or greater than the RAMP amplitude at the first time from the time when AZ activation is finished to the first time count in the case in which Vx drops in the first time read. In other words, in this situation, after the first time read is finished, when the non-inverted output of the comparator 13 is latched in the latch 51 inside the control module 21 for the output of the comparator by the SUNLAT signal, the output of the NOR logic gate 52 is fixed at high level due to the output of the latch 51 even at the time when the subsequent signal level is measured with the output of the comparator remaining as it is until the XRST signal is activated. Therefore, the high level state is kept at the reset level and the signal level. Thus, the read at the second time is in the state in which the counter 14 is working all the time for the count value at the second time, not depending on the output of the comparator 13. In other words, counts are fully made to be the white state.

This is the characteristic of the configuration according to an embodiment of the invention in that such a state can be created. The circuit to implement this is the circuit configuration descried with reference to FIG. 4. Therefore, an embodiment of the invention is a latch module, having one of advantages that the dark defect can be prevented with no provision of a module for detecting the dark defect phenomenon.

Here, the number of times to readout is limited to two times, a similar configuration may be done by the even numbered times equal to or greater than two times, exerting the same advantages. In other words, since comparison is made to detect an abnormal event in the first time read (the output of the comparator is measured) for control by one time comparison, it is necessary to make comparison for at least two times. Therefore, it is necessary to make comparison for the even numbered times. Also in the read at the even numbered time, the read at the add numbered time is the read of the analog signal (reset component) of the reference among the reads for the even numbered times, and the read at the even numbered time contains the signal component and the reset component. In other words, the operation is conducted in such a way that the reset component is read in the read at the add numbered time to measure the output of the comparator 13, the signal component is read in the read at the even numbered time, and then the output of the comparator is controlled.

In addition, the counter 14 in the configuration according to the first embodiment may be arranged at the end part of each of the pixel columns. In addition, the counter may be partially shared to arrange at the end part of the pixel column, or may be arranged outside the pixel column.

Figure 6:
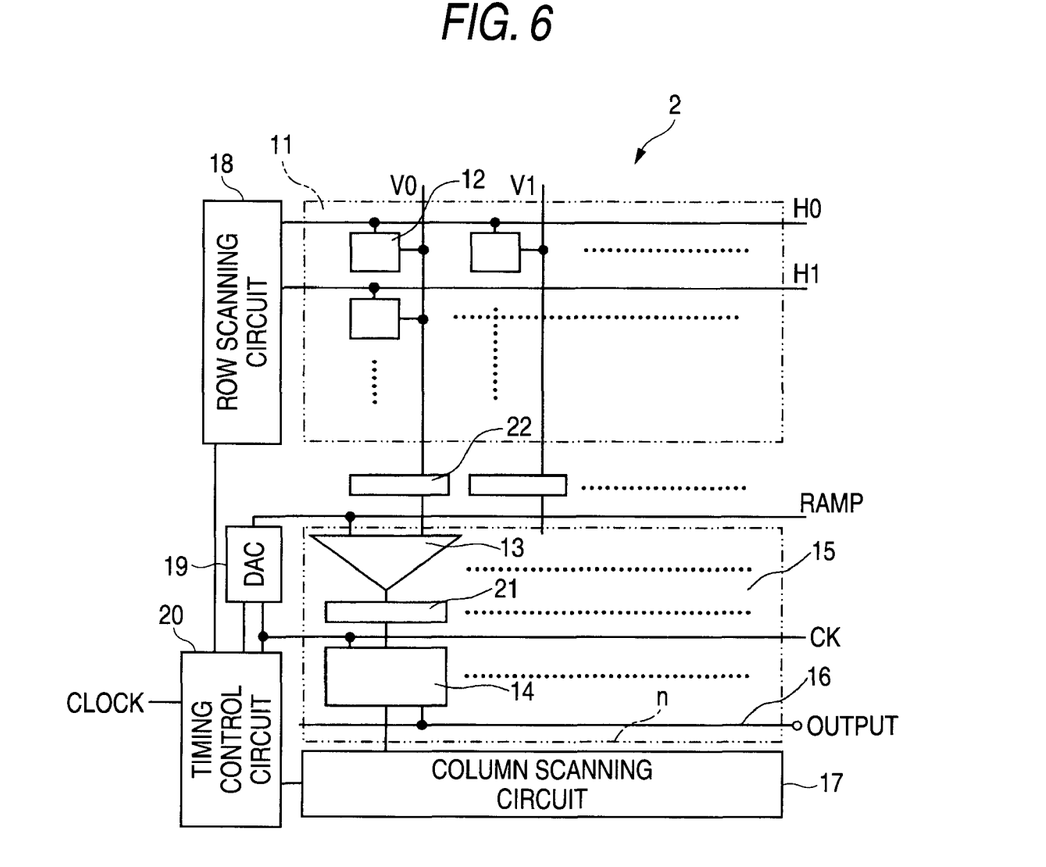
FIG. 6 shows a block diagram depicting an embodiment (second embodiment) of the invention.

Next, an embodiment (second embodiment) of the invention will be described with reference to a block diagram shown in FIG. 6. For describing the second embodiment of the invention, FIG. 6 shows a CMOS imaging sensor on which a column parallel analog/digital converting unit is mounted. In addition, FIG. 7 shows a timing chart depicting the second embodiment of the invention.

A solid-state imaging device 2 according to the second embodiment takes it into account that the value of the vertical signal line Vx completely drops before comparison is started when the light of higher intensity enters. In this case, since it is difficult to create the state in which the output of the comparator is not inverted, the principle of operation described in the first embodiment may not be used. Then, to the solid-state imaging device 2 according to the second embodiment, a correcting module 22 is added in the first embodiment which corrects the value of the column signal line Vx. The other configurations and the operation are similar to those of the first embodiment, but the correcting module 22 is additionally provided to eliminate the dark defect phenomenon even though the drop rate and the amount of drop of the column signal line Vx are great in the first time read.

In the first embodiment, the dark defect phenomenon can be prevented when the amount of drop of the value of the column signal line Vx is "equal to or greater than the amplitude of the reference line RAMP at the first time from the time when AZ activation is finished to the first time count". In other words, the dark defect phenomenon may not be prevented when the amount of drop of the value of the column signal line Vx is "equal to or below the amplitude of the reference line RAMP at the first time from the time when AZ activation is finished to the first time count".

Figure 7:
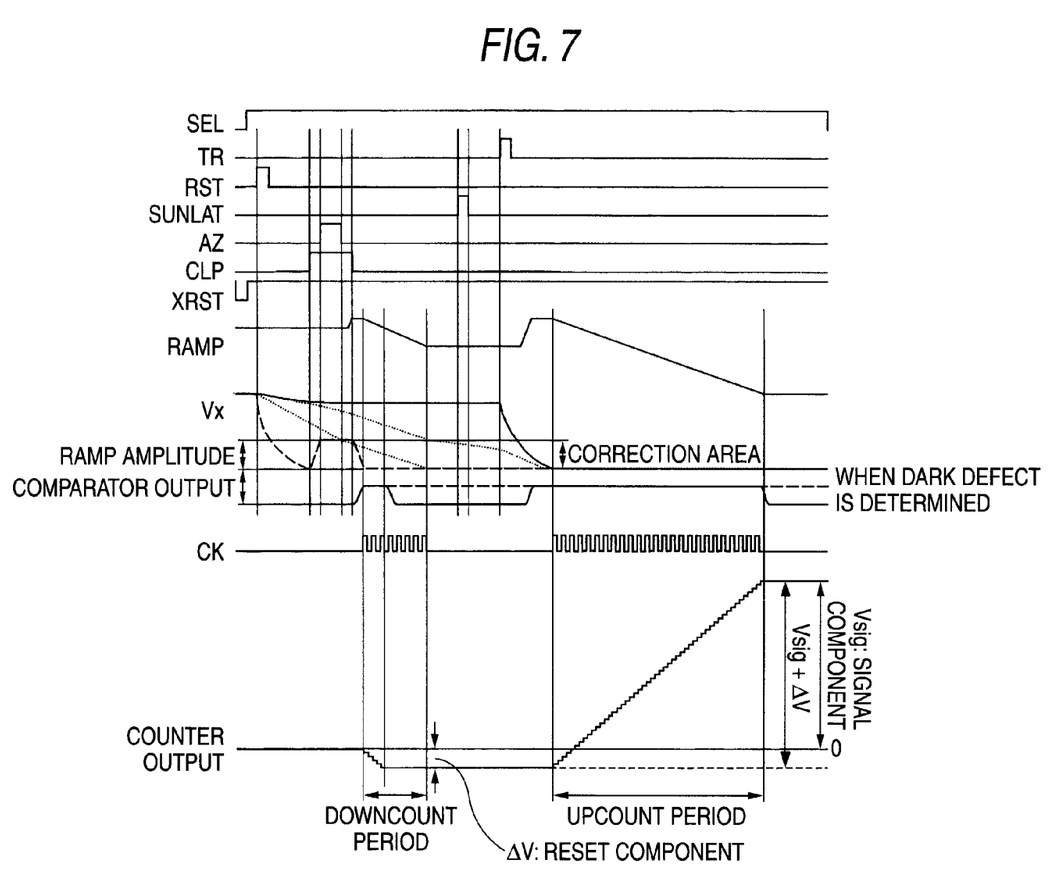
FIG. 7 shows a timing chart depicting the second embodiment.

For example, as shown in FIG. 7, in the column signal line Vx, a solid line depicts the normal time, and in this case, the dark defect phenomenon does not occur. A dotted line depicts the case in which the value of the column signal line Vx drops in the first time read. However, it is the case in which "it is equal to or greater than the amplitude of the reference line RAMP at the first time from the time when AZ activation is finished to the first time count". Therefore, the dark defect phenomenon can be prevented by the configuration according to the first embodiment. Another dotted line depicts the case in which the drop rate of the value of the column signal line Vx is much greater, and the value of the column signal line Vx completely drops at the time when AZ activation is finished. It falls in the case in which "it is equal to or below the amplitude of the reference line RAMP at the first time from the time when AZ activation is finished to the first time count". It is difficult to prevent the dark defect phenomenon by the configuration according to the first embodiment.

Then, in the second embodiment, the correcting module 22 which corrects the value of the column signal line Vx corrects the value of the column signal line Vx completely dropping quickly during the AZ activation period, whereby the case is created in which "it is equal to or greater than the amplitude of the reference line RAMP at the first time from the time when AZ activation is finished to the first time count", and the dark defect phenomenon is prevented.

In other words, when the value of the column signal line Vx is completely drops, the value of the column signal line Vx is temporarily increased during the time in which a clamp (CLP) pulse is inputted, and the similar state as the first embodiment is created. More specifically, at the start and the end of measuring the reset level, the state is created in simulation in which the column signal line Vx operates equal to or greater than the amplitude of the reference signal of the reference line RAMP. Accordingly, the level can be retained to the abnormal output of the comparator 13, that is, to the high level state not inverted. Suppose this state can be created, after that, as similar to the first embodiment, the output is latched by the SANLAT signal, and the output of the comparator 13 is fixed at the high position, whereby the dark defect phenomenon can be prevented from occurring.

Figure 8:
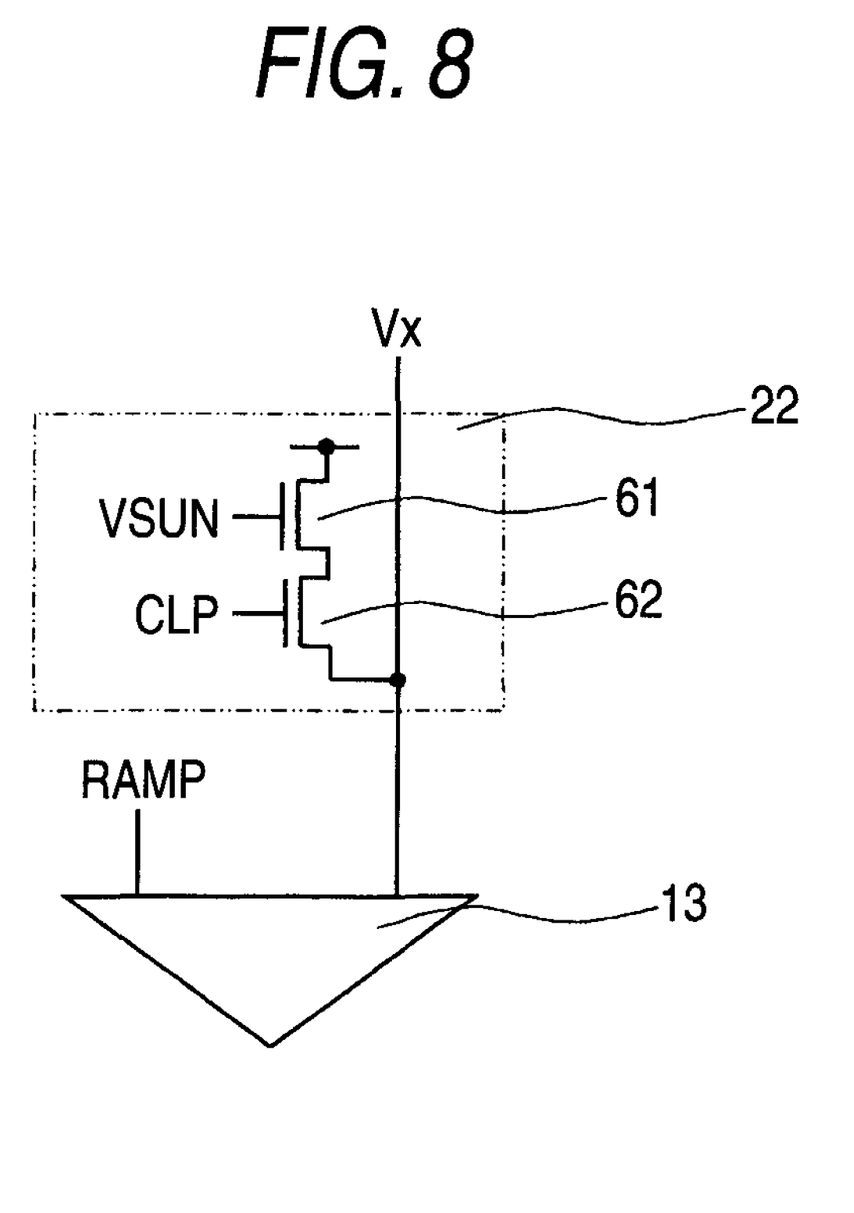
FIG. 8 shows a circuit diagram depicting an exemplary circuit configuration of means for correcting.

Next, FIG. 8 shows a circuit diagram depicting an exemplary circuit configuration of the correcting module 22 which corrects the value of the column signal line Vx.

As shown in FIG. 8, the correcting module 22 is configured of a drive transistor 61 operable to supply the value equal to or greater than the amplitude of the reference line RAMP at the first time to the column signal line Vx in any cases, and a clamp transistor 62 operable to control the column signal line Vx only during the AZ period. It is necessary to turn the value of VSUN to have (the minimum value of the column signal line Vx)+(the amplitude value of the reference line RAMP at the first time)+(the threshold of the drive transistor 61)+α in order to supply the value equal to or greater than the RAMP amplitude at the first time to the column signal line Vx in any cases. Here, the transistor is a N channel transistor, but a similar configuration may be done by a P channel transistor.

In the configuration, when a switch formed of a clamp transistor 62 is turned on by a signal from the clamp (CLP), the column signal line Vx is connected to a drive transistor 61 to which the analog level VSUN is connected, whereby the dark defect can be prevented.

In inputting the clamp signal (CLP), when the value of the column signal line Vx is outputted at the normal level, the drive transistor 61 of VSUN is not turned on because reverse bias is applied. On the other hand, when the output value of the column signal line Vx drops, that is, it drops more than the level of VSUN, it drops more than the threshold level of the drive transistor 61, the drive transistor 61 is turned on to increase the value of the column signal line Vx. For the level to increase, the analog level VSUN is set so as to be equal to or greater than the amplitude of the reference signal of the reference line RAMP, whereby a state similar to the first embodiment is created to make the state in which the output of the comparator 13 is not inverted.

In addition, also in the configuration, a configuration may be done in which VSUN and a power source are switched without using the clamp transistor 62.

In the second embodiment, the analog circuit is additionally provided to the analog area, but it is used in a limited manner at the degree of the operation and in time as well in the restricted area in which the dark defect may not be prevented by the circuit according to the first embodiment. Therefore, the operation of the analog circuit is little adversely affected as compared with analog detection and analog correction before.

Figure 12:
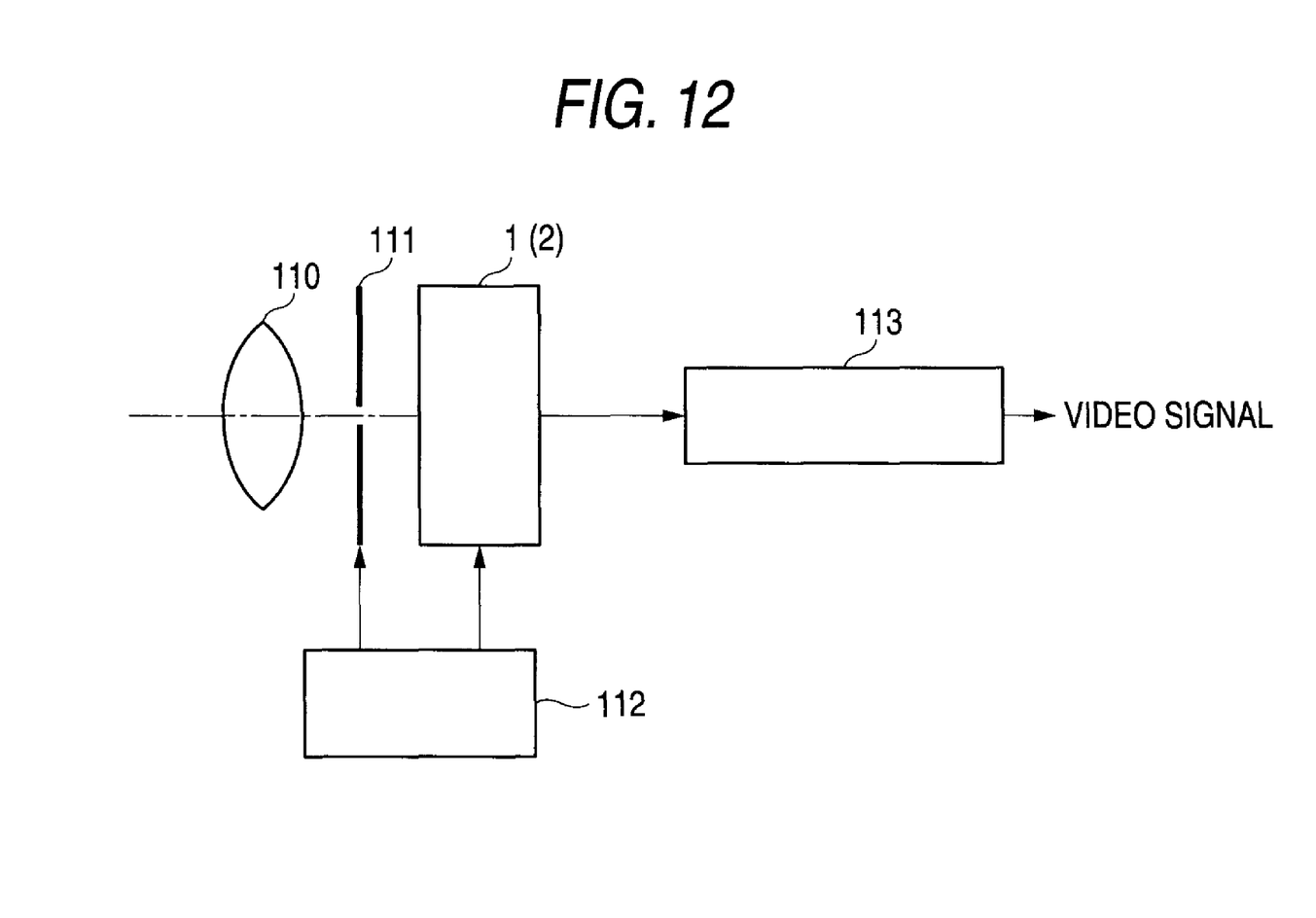
FIG. 12 shows a cross section depicting a camera according to an embodiment of the invention.

FIG. 12 shows across section depicting a camera according to the embodiments of the invention. The camera according to the embodiment is an exemplary video camera which can shoot moving images.

The camera according to the embodiment has a solid-state imaging device 1 or 2, an optical system 110, a shutter unit 111, a drive circuit 112, and a signal processing circuit 113.

The optical system 110 forms an image of light (incident light) from a subject on the imaging area of the solid-state imaging device 1 or 2. Thus, signal charge is stored in the solid-state imaging device 1 or 2 for a predetermined time period.

The shutter unit 111 controls the time period to apply light and the time period to block light onto the solid-state imaging device 1.

The drive circuit 112 supplies a drive signal that controls the transfer operation of the solid-state imaging device 1 or 2 and the shutter operation of the shutter unit 111. The electric charge of the solid-state imaging device 1 is transferred by the drive signal (timing signal) supplied from the drive circuit 112. The signal processing circuit 113 performs signal processing in various ways. The video signal having been applied to signal processing is stored in a storage medium such as a memory, or outputted to a monitor.

It should be understood by those skilled in the art that various modifications, combinations, sub-combinations and alterations may occur depending on design requirements and other factors insofar as they are within the scope of the appended claims or the equivalents thereof.

What is claimed is:
1. A solid-state imaging device comprising:
an analog-digital converter unit in column parallel arrangement, the analog-digital converter unit having a plurality of pixels arranged to convert an incident light quantity to an electric signal, in which an analog signal obtained from the pixel is converted into a digital signal,
wherein the analog-digital converter unit is configured of:
a comparator operable to compare a value of a column signal line from which an analog signal obtained by the pixel is outputted with a value of a reference line, and
a counter operable to measure a time period by the time when comparison done by the comparator is finished and to store the comparison result,
wherein the solid-state imaging device further includes:
means for controlling an output of the comparator operable to control the output of the comparator depending on the output of the comparator.

2. The solid-state imaging device according to claim 1, wherein the comparator makes a comparison of a value of a reference line with a value of a vertical signal line for even numbered times, and controls the output of the comparator by a comparison at an even numbered time depending on the output of the comparator at a comparison at an add numbered time.

3. The solid-state imaging device according to claim 2, wherein the comparison at the add numbered time is that an analog signal to be the reference obtained from the pixel is read to a column signal line, and
the comparison at the even numbered time is that an analog signal relating to an incident light quantity obtained from the pixel is read to a column signal line.

4. The solid-state imaging device according to claim 3, wherein a comparison time period at the add numbered time is the same or shorter than a comparison time period at the even numbered time.

5. The solid-state imaging device according to claim 1, wherein the means for controlling the output of the comparator forms the output of the comparator to a fixed value or a comparison result output value depending on the output of the comparator.

6. The solid-state imaging device according to claim 2, comprising means for initializing operable to initialize an operating point of the comparator by a predetermined value of the column signal line and the reference line before a comparison at the add numbered time is made.

7. The solid-state imaging device according to claim 1, comprising means for correcting operable to correct a value of a column signal line depending on a value of the column signal line.

8. The solid-state imaging device according to claim 7, wherein the correcting means detects a drop of a value of the column signal line, and corrects a value equal to or greater than an amplitude of a reference line at a comparison at an add numbered time.

9. The solid-state imaging device according to claim 8, wherein a drop of a value of the column signal line is detected ranging from a minimum value that the column signal line possibly takes to a value that the minimum value is added with an amplitude of the reference line at a comparison at add numbered time.

10. The solid-state imaging device according to claim 9, wherein correction depending on a value of the column signal line is performed only during a period in which an operating point of the comparator is initialized.

11. A method of driving a solid-state imaging device having an analog-digital converter unit in column parallel arrangement, the analog-digital converter unit having a plurality of pixels arranged to convert an incident light quantity to an electric signal, in which an analog signal obtained from the pixel is converted into a digital signal,
the method comprising the steps of:

comparing a value of a column signal line from which an analog signal obtained by the pixel is outputted with a value of a reference line by a comparator, measuring a time period by the time when comparison done by the comparator is finished and storing the comparison result by a counter, and controlling an output of the comparator depending on the output of the comparator.

12. A camera comprising:

a solid-state imaging device having an analog-digital converter unit in column parallel arrangement, the analog-digital converter unit having a plurality of pixels arranged to convert an incident light quantity to an electric signal, in which an analog signal obtained from the pixel is converted into a digital signal, wherein the analog-digital converter unit is configured of:

a comparator operable to compare a value of a column signal line from which an analog signal obtained by the pixel is outputted with a value of a reference line, and a counter operable to measure a time period by the time when comparison done by the comparator is finished and to store the comparison result, wherein the solid-state imaging device further includes:

means for controlling an output of the comparator operable to control the output of the comparator depending on the output of the comparator.

13. A solid-state imaging device comprising:

an analog-digital converter unit in column parallel arrangement, the analog-digital converter unit having a plurality of pixels arranged to convert an incident light quantity to an electric signal, in which an analog signal obtained from the pixel is converted into a digital signal, wherein the analog-digital converter unit is configured of:

a comparator operable to compare a value of a column signal line from which an analog signal obtained by the pixel is outputted with a value of a reference line, and a counter operable to measure a time period by the time when comparison done by the comparator is finished and to store the comparison result, wherein the solid-state imaging device further includes:

a module for controlling an output of the comparator operable to control the output of the comparator depending on the output of the comparator.

14. A camera comprising:

a solid-state imaging device having an analog-digital converter unit in column parallel arrangement, the analog-digital converter unit having a plurality of pixels arranged to convert an incident light quantity to an electric signal, in which an analog signal obtained from the pixel is converted into a digital signal, wherein the analog-digital converter unit is configured of:

a comparator operable to compare a value of a column signal line from which an analog signal obtained by the pixel is outputted with a value of a reference line, and a counter operable to measure a time period by the time when comparison done by the comparator is finished and to store the comparison result, wherein the solid-state imaging device further includes:

a module for controlling an output of the comparator operable to control the output of the comparator depending on the output of the comparator.

* * * * *